(12) United States Patent
Jacobson et al.

(10) Patent No.: US 6,571,382 B1
(45) Date of Patent: May 27, 2003

(54) METHOD AND CIRCUIT FOR SAFELY REPROGRAMMING A LOGIC DEVICE

(75) Inventors: Neil G. Jacobson, Mountain View, CA (US); Matthew T. Murphy, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 135 days.

(21) Appl. No.: 09/758,597

(22) Filed: Jan. 10, 2001

(51) Int. Cl.[7] .............................................. G06F 17/50
(52) U.S. Cl. ........................................... 716/16; 716/17
(58) Field of Search ............................... 713/1, 2, 100; 709/221, 222; 710/10

(56) References Cited

U.S. PATENT DOCUMENTS 5,815,405 A * 9/1998 Jones et al. ..................... 716/9
5,862,365 A * 1/1999 Modo et al. .................. 703/23
5,946,478 A * 8/1999 Lawman ...................... 716/16
6,205,574 B1 * 3/2001 Dellinger et al. .......... 340/14.3

* cited by examiner

Primary Examiner—Vuthe Siek
Assistant Examiner—Brandon Bowers
(74) Attorney, Agent, or Firm—Adam H. Tachner; Edel M. Young; Lorraine Hirsch

(57) ABSTRACT

A method and apparatus are disclosed for reducing the likelihood of unintentionally or irreversibly activating one or more of a programmable logic device's output elements after a programming interruption. Output disable and enable bits are moved to near the beginning and end, respectively, of a programming bitstream, thereby maximizing the amount of time the device outputs are in high impedance mode during programming, and minimizing the risk of unintentionally driving the device outputs.

4 Claims, 6 Drawing Sheets

US 6,571,382 B1

METHOD AND CIRCUIT FOR SAFELY REPROGRAMMING A LOGIC DEVICE

FIELD OF THE INVENTION

The present invention is related generally to the field of programmable logic devices and more particularly to an improved method and circuit for programming a programmable logic device, particularly an in-system programming ("ISP")-compatible programmable logic device.

BACKGROUND OF THE INVENTION

Reprogrammable logic devices provide the ability to program a device to perform one function, then alter or replace that function by reprogramming the device. Volatile reprogrammable devices lose their programmed functionality when powered off, whereupon they move to a default state with all output drivers placed in a high-impedance mode. Non-volatile devices retain their programmed functionality until erased and reprogrammed, regardless of power availability. In devices that retain their functionality after power-down (e.g., long term stable devices such as Complex Programmable Logic Devices ("CPLDs") available from Xilinx, Inc., assignee of the present invention), there is a possibility that a power interruption during erasing or programming can lead to an incorrectly programmed device incapable of operating properly, of being deactivated, or of being reprogrammed to its proper function, due to the dysfunctional state in which the device is left after the interrupted programming cycle. This possibility is especially risky for devices programmed outside a controlled environment dedicated to the reprogramming function.

In-System Programming ("ISP")-enabled devices are often programmed within the system in which they normally function (e.g., as a substitute for an application specific integrated circuit ("ASIC") within a network appliance), instead of within a dedicated programming apparatus. While the potential loss from the unlikely event of a power interruption during programming is minimal where the device need be simply disposed of and a replacement obtained and programmed in its place, the potential loss of time and effort for repairs is far greater where the device is integrated within a multi-component, remote-programmable system at the time of programming, as is often the case with an ISP-enabled device. Thus, while ISP-enabled devices are highly advantageous in enabling remote upgrade of hardware systems, even over wide area networks such as the Internet, if an ISP-enabled device's programming cycle is interrupted by a power failure or other malfunction and the interruption results in device dysfunction, that dysfunction may render an entire device, system or network incapable of re-initializing. Moreover, where a system is remotely programmed due to access difficulty issues, the cost of having to dismantle the system to replace the programmable device can be quite high. It is therefore desirable to substantially reduce or eliminate the risk that a reprogrammable device will be rendered dysfunctional or unusable by an ill-timed power lapse or similar complication during device programming.

To understand how the invention addresses this need, it will be useful to explain the basic elements of non-volatile device reprogramming. Although this description applies particularly to CPLDs available from Xilinx®, Inc., assignee of the invention, the programming sequence applies generally to any available non-volatile programmable device, as will be understood by those skilled in the art to which the invention pertains. Most CPLD devices are programmed (that is, they store their programming information) with a non-volatile means such as EPROM cells or flash transistors. EPROM programming involves raising voltages at certain transistor gates to a high level and maintaining the high level until sufficient charge has flowed onto or away from a floating gate of the transistor to cause the transistor to maintain a certain state when the high voltage is removed. Typically, a stream of programming and other data (a "bitstream") several thousand bits long can be shifted into several devices in less time than is required to program a single non-volatile transistor in a device. Thus, a practical and widely used programming procedure is to serially shift a programming instruction and a unit of data to be programmed, and then move into a programming mode during which all addressed cells are programmed simultaneously, as specified by the programming data. This sequence is repeated (absent the shifting-in of the programming instruction) until all cells in the device are programmed. Design synthesis software is normally used to create the programming bitstream used to configure the device or devices.

The period of time required to shift programming data into and program such devices increases their susceptibility to programming interruption via random power loss or other complications. For example, referring to FIG. 1, an ISP-enabled CPLD 10 is typically wired into a system 20 including a microprocessor 12 and an external memory unit 14, with a common bus 16 shared by the three integrated circuit devices on board 8. If power to CPLD 10 is interrupted during reprogramming, a partially or incorrectly programmed CPLD could irretrievably tie up common bus 16, particularly if the output drivers of CPLD 10 are stuck in an active mode driving a high current, thereby rendering dysfunctional all of board 8, and potentially all of system 20 and any network to which it might be attached.

There is therefore a need in the art for a method and system for safely reprogramming in-system, reprogrammable logic devices.

SUMMARY OF THE INVENTION

To address the shortcomings of the available art, the present invention provides a method and system for reducing the likelihood of reprogrammable device programming errors, particularly those caused by power interruptions, by reducing the time within which such interruptions can result in system errors. To this end, the programming data bitstream is configured such that all elements controlling the device outputs (controlled by output enable or "OE" bits) are set to a high impedance (tristate) mode at or near the beginning of the programming process and are programmed at or near the end of the process, thereby reducing or minimizing the amount of time the device is vulnerable to power outages that might result in an unknown output-driving condition.

An alternative embodiment further comprises defining a single bit in the programming data bitstream as a single I/O enable bit, whereby the device output drivers remain in a high-impedance mode until the I/O enable bit is received. By providing the device with this critical I/O enable bit near the end of the programming bitstream, the amount of time the device remains vulnerable to power loss is further decreased.

In yet another embodiment, a still additional mechanism for reducing risk is provided, comprising a current sensor circuit integrated with device I/O circuitry, for sensing high output current and deactivating the I/O circuitry where high current is sensed but not expected.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

Figure 1:
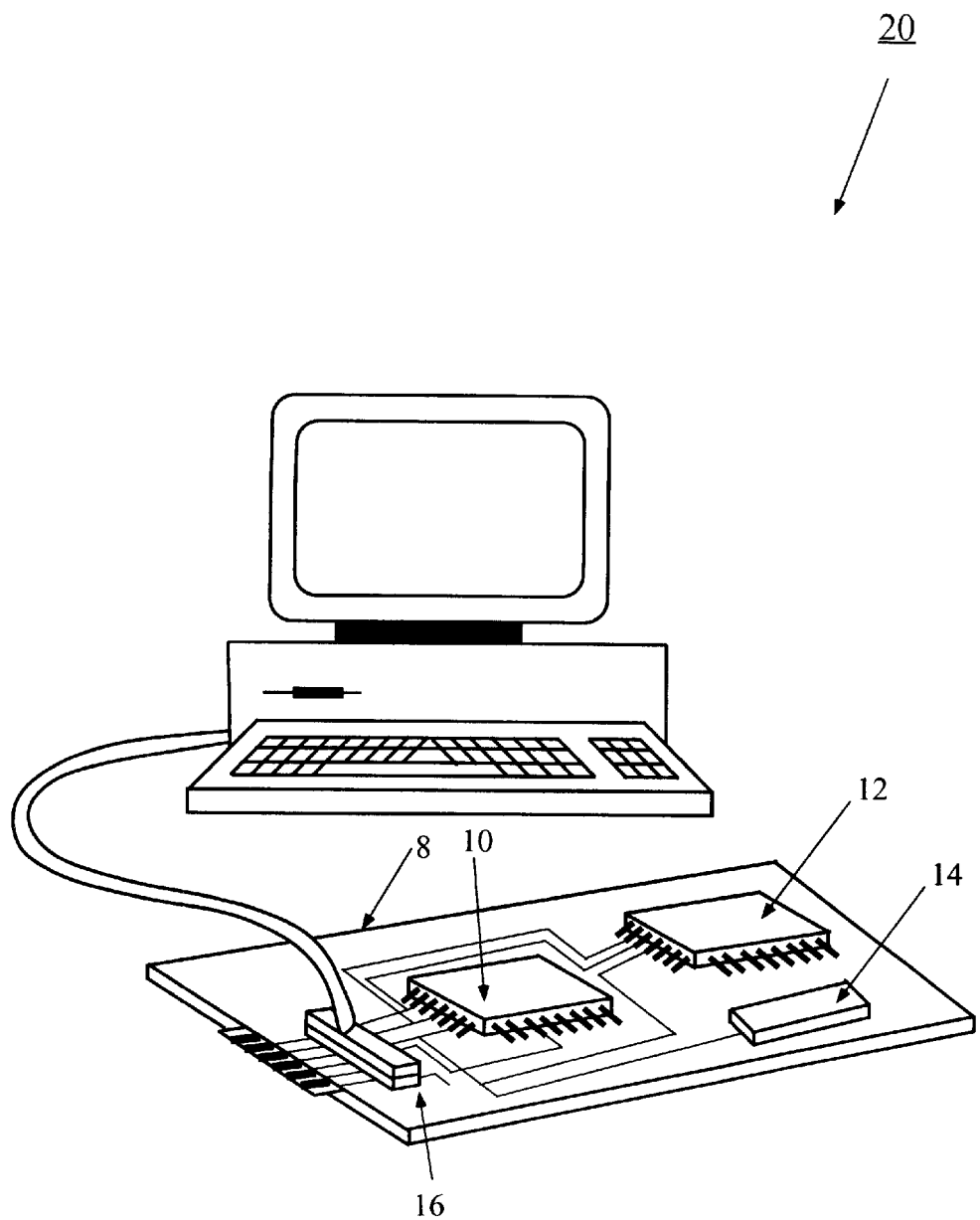
FIG. 1 illustrates a reprogrammable logic device disposed within an in-system programming (ISP)-compatible environment.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF A PREFERRED EMBODIMENT

Figure 2:
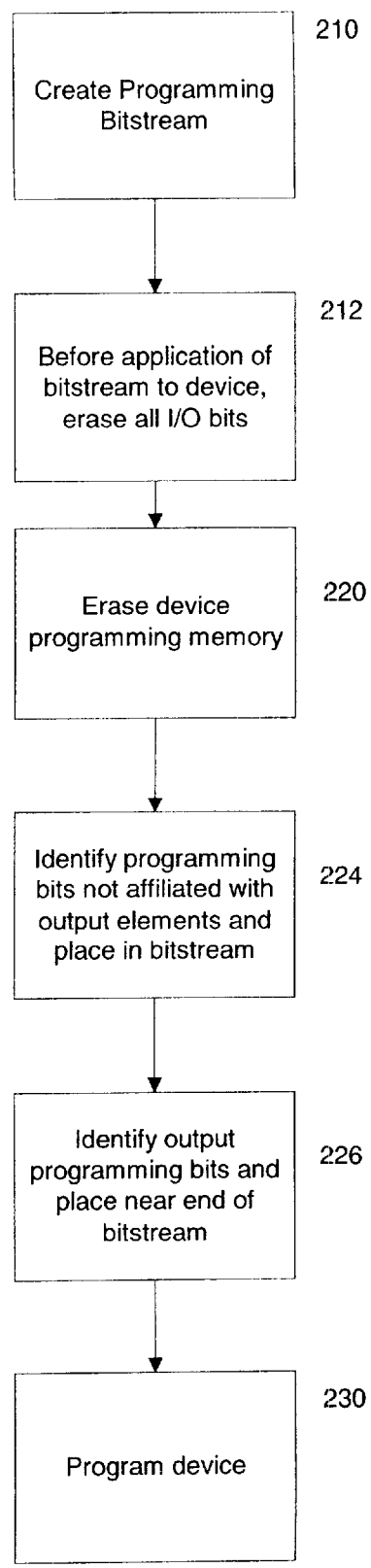
FIG. 2 is a flowchart illustrating the method of the invention.

The present invention therefore comprises a method and system for substantially reducing or eliminating the risk that a power interruption during device programming will lead to an unknowable or undesirable device output state. Referring to FIG. 2, there is provided a flowchart illustrating the method 200 of the invention, wherein the programming data bitstream is formatted to reduce the risk of a dysfunctional result due to an interruption of the programming flow.

At step 210, a programming bitstream is created using any available method, for example, those enabled by Foundation® and Alliances series software, available from Xilinx®, Inc., assignee of the invention. Next, at step 212, before application of the programming bitstream, all I/O control bits on the device are erased, placing all Output Enable ("OE") buffering devices into a high impedance mode. The period of a device's vulnerability to power lapse begins with the commencement of device erasure and ends with completion of device reprogramming, and depends primarily on the state of the output enable elements of the device. At step 224, the bits relevant to erasure and reprogramming of the device are added to the bitstream starting at a point after, but not necessarily immediately adjacent to, the last output enable erasure bit. Finally, at step 226, the bits responsible for programming the output enable elements of the device are identified and added at a still-later point in the bitstream. At step 220, the device's programming memory is erased according to any method generally understood in the art. It should be noted that steps 224 and 226 may be integrated into the available method of formation of the bitstream or the process of building the programmed design instead of into a separate reorganization step, as will be easily understood by those skilled in the art. Turning next to step 230, the inventively formatted bitstream is forwarded to the device during programming.

It should be understood that the bits responsible for both programming and erasing the device are stored in specific memory addresses. These addresses must be known, a priori, for any device to which the method of the invention is applied.

Figure 3:
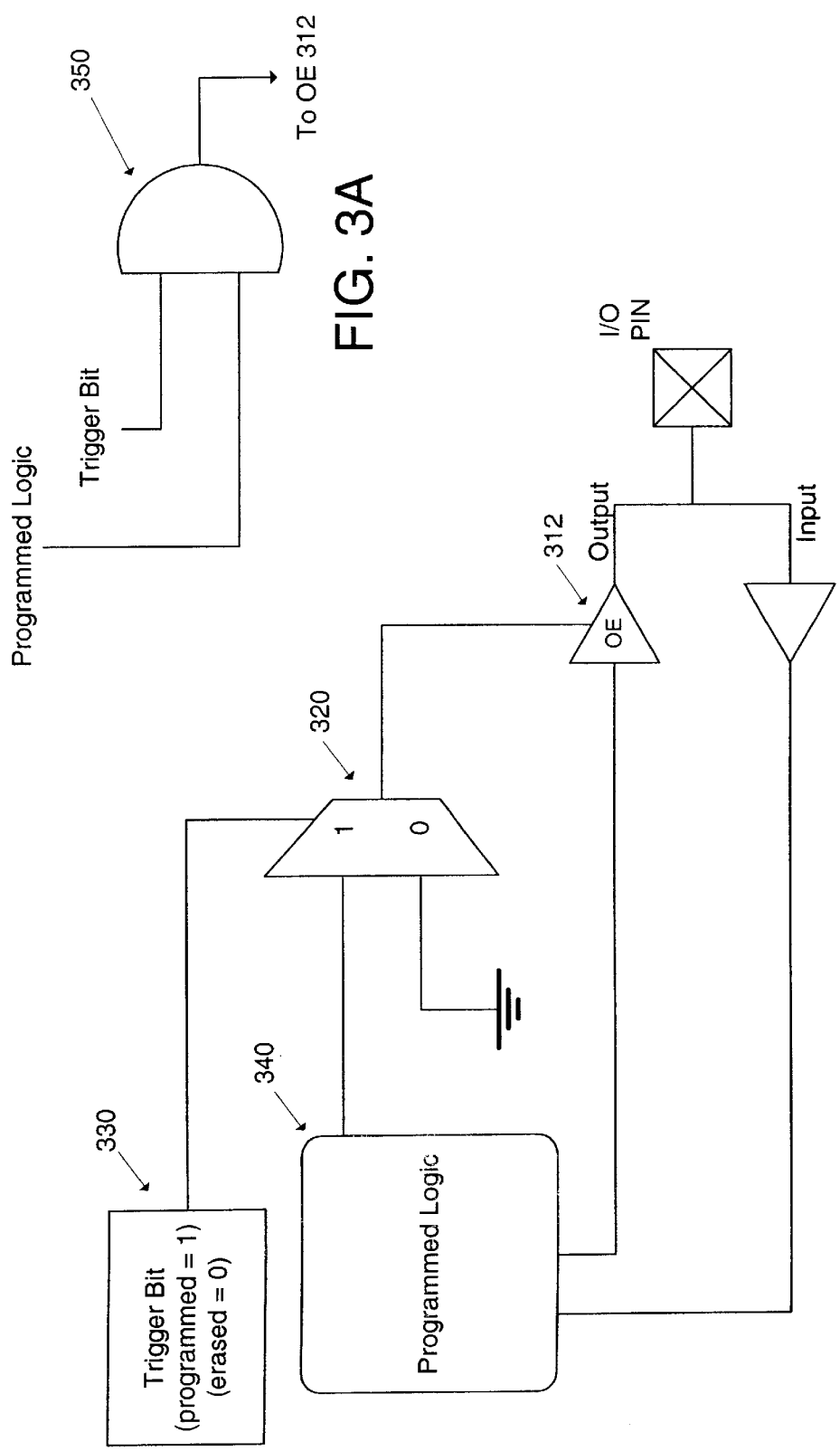
FIG. 3 illustrates an I/O circuit for a reprogrammable device including the I/O trigger bit feature of the invention.

In a first alternative embodiment, the device can be configured such that a single trigger-bit, placed near the end of a programming bitstream, must be received by the device before any of the outputs are enabled. This further reduces the vulnerability time, since only while the trigger-bit is being programmed could a power loss affect device functionality. FIG. 3 illustrates a preferred circuit for implementing the trigger bit enhancement of the invention. In a preferred embodiment, to the available pin driver logic is added a multiplexer 320 having a select line connected to a programmable trigger bit memory element 330. In the erased state, trigger bit 330 is set to zero, causing multiplexer 320 to disable (tristate) output enable ("OE") buffer 312, thereby forcing the output to a high impedance mode. When programmed, trigger bit 330 is set to one and multiplexer 320 causes OE buffer 312 to drive the output according to the programmed logic 340 of the user's design.

Using the circuit of FIG. 3, one trigger bit can therefore be provided for all pin drivers on a device, or one for each of a plurality of pin groups, or one trigger for each device pin driver. In an alternative embodiment, the trigger bit may be integrated into the OE buffer control logic, replacing multiplexer 320. Moreover, multiplexer 320 could be replaced with a logical AND gate 350, as illustrated in FIG. 3A.

Figure 5:
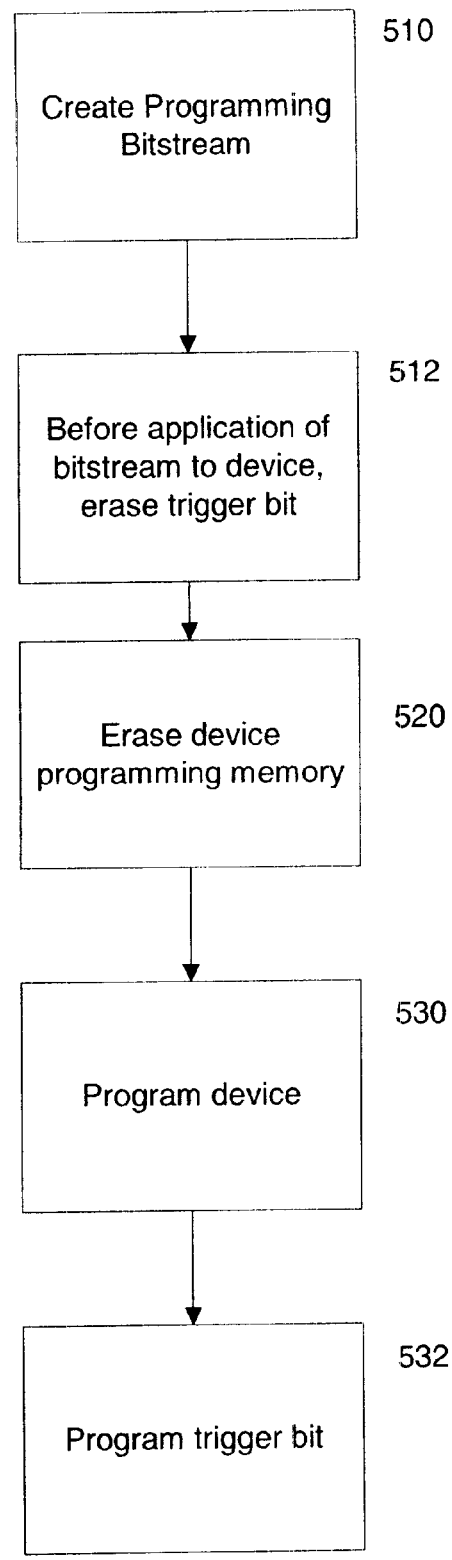
FIG. 5 is a flowchart illustrating the method of the invention including the apparatus of FIG. 3.
Figure 6:
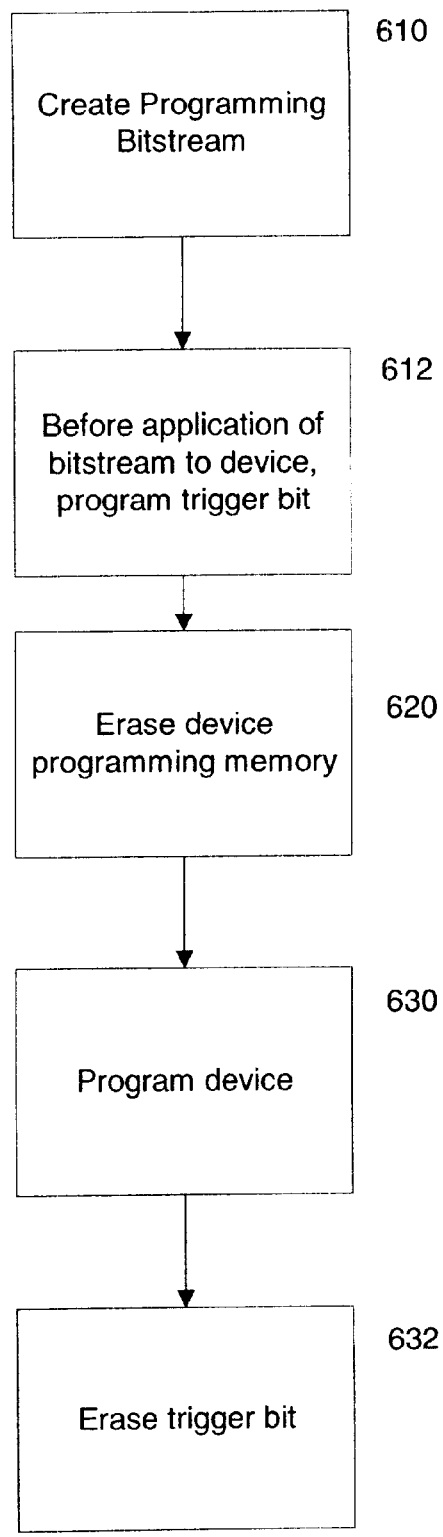
FIG. 6 is a flowchart illustrating an alternative method of the invention including the apparatus of FIG. 3.

Referring next to FIG. 5, there is provided a flowchart illustrating an alternative method of the invention incorporating the circuit of FIG. 3. Once the bitstream is created at step 510, trigger bit 330 is erased, enabling erasure of the device programming memory at step 520 and programming of the device at step 530 without risk of generating an unexpected output. The program trigger bit is then set at step 532, and the device is activated. FIG. 6 illustrates the same process where the trigger bit is, instead, active low. In this alternative, by programming the trigger bit at step 612, OE buffer 312 is disabled (via an inverter, not shown, placed between the trigger bit and OE buffer 312).

Figure 4:
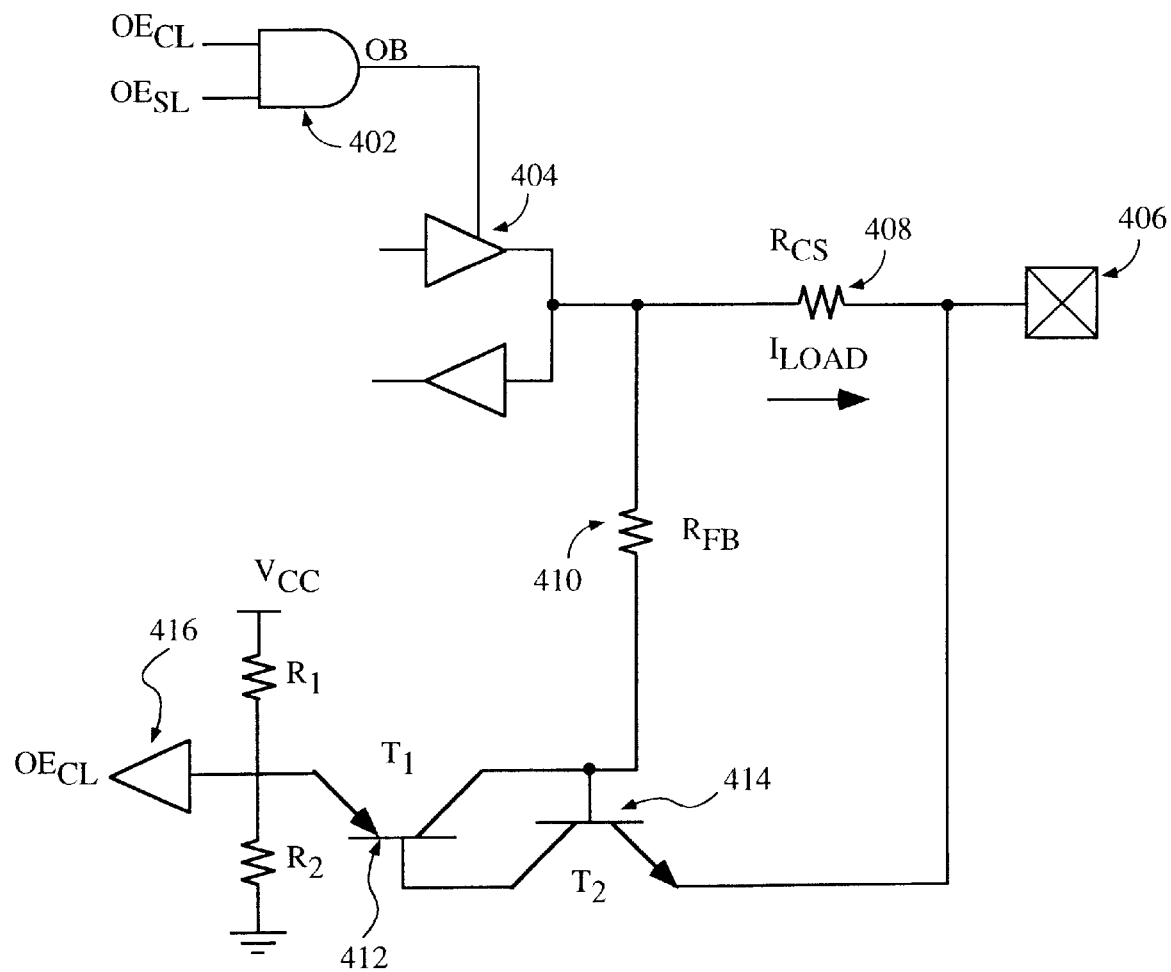
FIG. 4 is a current sensing circuit enabling a feature of the invention.

An additional modification is preferably added to the device output circuitry, whereby the circuit illustrated in FIG. 4 limits output current whenever a predetermined output current threshold level is crossed, thereby preventing the device from monopolizing an attached system bus even if the other protections of the present invention should prove insufficient. Output controlling AND gate 402 receives two input signals, $OE_{s1}$ and $OE_{c1}$, triggering device output signal driver 404 to drive pad 406 when both input signals are logic high, and to suspend output when either input signal is logic low. Resistor $R_{fb}$ 410 preferably offers far greater resistance than resistor $R_{cs}$ 408 nearer pad 406, as reflected in the equation $$R_{fb} >> R_{cs}$$

Transistors $T_1$ 412 and $T_2$ 414 are normally off. When current $I_{load}$ across resistor $R_{cs}$ 408 increases enough for transistor $T_2$ 414 to activate, (that is, $Iload*Rcs \geq V_{BE:T2}$) transistor $T_1$ 412 activates as well, creating a latching effect. In addition, when both transistors are activated, output signal $OE_{c1}$ at buffer 416 is pushed to logic low, thereby deactivating output driver 404. This output disabling effect is preferably sustained by storing $OE_{c1}$ in the latch until power is reset or a special signal is received through a variation on the standard IEEE 1149.1 ISP instruction set, as will be understood by one skilled in the art to which the invention pertains. Resistor $R_{cs}$ 408 may be either predetermined, as preferred, or programmable, such that the circuit designer can set the output current threshold needed to trigger the above-described output-disable sequence.

The present invention therefore provides a novel method and structure for reducing the likelihood that a programmable device will improperly program if there is a lapse in power during the programming cycle, and protects against system bus monopolization even in the event of interrupted or otherwise improper programming results.

Although the present invention has been shown and described with respect to preferred embodiments, various changes and modifications lie within the spirit and scope of the claimed invention. For example, in the embodiment described above, the circuit of FIG. 4 might measure voltage or some other indication of output driver status other than current, or might take an entirely different form. Thus, the corresponding structures, materials, acts, and equivalents of all means or step plus function elements in the claims are intended to include any structure, material, or acts for performing the functions in combination with other elements as specifically claimed.

What is claimed is:

1. In a programmable logic device having a plurality of output elements, a method of reducing the likelihood of unintentionally or irreversibly activating one or more of the output elements after a programming interruption, the device being programmed through receipt of a programming data bitstream having a beginning and an end, the method comprising the steps of:
    a) erasing all bits affiliated with activation of said output elements to induce an inactive mode in said output elements;
    b) identifying a first plurality of bits within the bitstream, the first plurality of bits having no effect upon the plurality of output elements;
    c) identifying a second plurality of bits within the bitstream, the second plurality of bits activating programming of the plurality of output elements;
    d) placing the first plurality of bits near the beginning of the bitstream and the second plurality of bits near the end of the bitstream, thereby reducing the likelihood of unintentionally activating one or more of the output elements during a programming interruption by inducing an inactive mode in the output elements during a substantial portion of the period the device is being programmed; and
    e) employing said bitstream to program said device.

2. In a programmable device having a plurality of output elements, a method of reducing the likelihood of inadvertent activation of one or more output elements due to a programming interruption, the device being programmed by a received programming data bitstream having a beginning and an end, the method comprising the steps of:
    a) erasing all programmed bits in said device related to activation of said output elements;
    b) configuring a new bitstream by placing all bits related to activation of said output elements near the end of the bitstream to minimize the period of activation of output elements during programming; and
    c) applying said new bitstream to said device to program said device.

3. A programming circuit for use in of programming a programmable logic device having a plurality of output elements, while reducing the likelihood of unintentionally or irreversibly activating one or more of the output elements after a programming interruption, the device being programmed through receipt of a programming data bitstream having a beginning and an end, the circuit comprising:
    means for erasing all bits affiliated with activation of said output elements to induce an inactive mode in said output elements;
    means for identifying a first plurality of bits within the bitstream, the first plurality of bits having no effect upon the plurality of output elements;
    means for identifying a second plurality of bits within the bitstream, the second plurality of bits activating programming of the plurality of output elements;
    means for placing the first plurality of bits near the beginning of the bitstream and the second plurality of bits near the end of the bitstream, thereby reducing the likelihood of unintentionally activating one or more of the output elements during a programming interruption by inducing an inactive mode in the output elements during a substantial portion of the period the device is being programmed; and
    means for employing said bitstream to program said device.

4. A programming circuit for use with a programmable device having a plurality of output elements, while reducing the likelihood of inadvertent activation of one or more output elements due to a programming interruption, the device being programmed by a received programming data bitstream having a beginning and an end, the circuit comprising:
    means for erasing all programmed bits in said device related to activation of said output elements;
    means for configuring a new bitstream by placing all bits related to activation of said output elements near the end of the bitstream to minimize the period of activation of output elements during programming; and
    means for applying said new bitstream to said device to program said device.

* * * * *